73-632

2/18/86 XR 4,571,520 SR

United States Patent [19]

Saito et al.

[11] Patent Number: 4,571,520

[45] Date of Patent: Feb. 18, 1986

[54] ULTRASONIC PROBE HAVING A BACKING MEMBER OF MICROBALLOONS IN URETHANE RUBBER OR THERMOSETTING RESIN

[75] Inventors: Koetsu Saito, Sagamihara; Masami Kawabuchi, Yokohama; Keisaku Yamaguchi, Isehara; Keiji Iijima, Kawasaki, all of Japan

[73] Assignee: Matsushita Electric Industrial Co. Ltd., Osaka, Japan

[21] Appl. No.: 618,369

[22] Filed: Jun. 7, 1984

[30] Foreign Application Priority Data

| | | | |
|---|---|---|---|
| Jun. 7, 1983 | [JP] | Japan | 58-102024 |
| Jun. 7, 1983 | [JP] | Japan | 58-102026 |
| Apr. 2, 1984 | [JP] | Japan | 59-65363 |

[51] Int. Cl.[4] ............ H01L 41/08

[52] U.S. Cl. ............ 310/327; 310/334; 310/335; 73/632

[58] Field of Search ............ 310/326, 327, 334, 335, 310/336; 73/644, 632; 367/157, 162, 165, 176

[56] References Cited

U.S. PATENT DOCUMENTS

| | | | |
|---|---|---|---|
| 2,707,755 | 5/1955 | Hardie et al. | 310/327 |
| 3,661,146 | 5/1972 | Peronneau et al. | 310/327 X |
| 3,789,656 | 2/1974 | Miller | 310/327 X |
| 3,950,660 | 4/1976 | McElroy | 310/327 X |
| 3,969,927 | 7/1976 | Yoshida et al. | 310/327 X |
| 4,240,003 | 12/1980 | Larson | 310/327 X |
| 4,297,607 | 10/1981 | Lynnworth et al. | 310/327 X |
| 4,373,401 | 2/1983 | Baumoel | 73/644 X |
| 4,479,069 | 10/1984 | Miller | 310/327 X |
| 4,482,834 | 11/1984 | Dias et al. | 310/327 |
| 4,523,122 | 6/1985 | Tone et al. | 310/334 |

*Primary Examiner*—Mark O. Budd

*Attorney, Agent, or Firm*—Lowe, King, Price & Becker

[57] ABSTRACT

An ultrasonic probe for use in ultrasonic imaging systems includes an array of piezoelectric transducer elements. The array is backed by a rear member of an energy absorbing material composed of a mixture of urethane rubber and microballoons. The rear member has a Shore-A hardness greater than 85, an ultrasonic absorption coefficient greater than 1.5 dB/mm at the frequency of energy generated by the array and an acoustic impedance in the range between $1.0\times10^5$ g/cm$^2$ sec and $3.0\times10^5$ g/cm$^2$ sec. Alternatively, the rear member is composed of a mixture of thermosetting resin, microballoons and solid particles. Preferably, a thermosetting resin layer is provided between the array and the rear member to ensure against disconnection of wire leads from transducer electrodes.

14 Claims, 3 Drawing Figures

ULTRASONIC PROBE HAVING A BACKING MEMBER OF MICROBALLOONS IN URETHANE RUBBER OR THERMOSETTING RESIN

BACKGROUND OF THE INVENTION

This invention relates to ultrasonic transducers, and more particularly to an ultrasonic probe having a backing member for use in ultrasonic imaging systems.

A conventional ultrasonic probe generally comprises a linear array of piezoelectric transducer elements for transmission of an ultrasonic wave into a body under examination in response to electrical signals from a control circuit and reception of echo waves returning from structural discontinuities within the body. If required, an acoustic lens is provided at the energy entry surface of the transducer. A backing member is secured to the rear of the transducer array to absorb undesired ultrasonic energy emitted backward. It is required that the backing member be composed of a material having a sufficient amount of hardness to give structural integrity to the transducer array and a high degree of precision, consistent physical properties, a large value of acoustic energy absorption coefficient to keep the probe compact and lightweight, and a desired acoustic impedance to ensure against reduction in sensitivity of the ultrasonic transducers.

A known backing member is composed of a mixture of tungsten particles and ferrite rubber or plastic having a Shore-A hardness greater than 85, and an acoustic impedance of greater than $6\times10^5$ g/cm$^2$·sec. Although satisfactory in mechanical strength, this backing member is not satisfactory in the performance of energy absorption due to the small difference in acoustic impedance between it and the piezoelectric elements.

Another known backing member is composed of a mixture of silicone rubber and alumina oxide having an acoustic impedance greater than $1.5\times10^5$ g/cm$^2$·sec and ultrasonic absorption coefficient greater than about 1.5 dB/mm at 3MHz. Although satisfactory in absorption performance, this material is not satisfactory in mechanical strength.

Therefore none of the conventional backing members satisfy both the strength and absorption requirements.

SUMMARY OF THE INVENTION

It is therefore an object of the present invention to provide a backing member having desired hardness and ultrasonic absorption coefficient which are satisfactory for ultrasonic probes.

In accordance with this invention, an array of ultrasonic transducers is provided with a backing member having a Shore-A hardness greater than 85, an ultrasonic absorption coefficient greater than 1.5 dB/mm at a frequency of 3 MHz and an acoustic impedance in the range between $1.0\times10^5$ g/cm$^2$·sec to $3.0\times10^5$ g/cm$^2$.sec.

In a preferred embodiment, the backing member is composed of urethane rubber, or a mixture of urethane rubber and microballoons formed of glass or plastic, or a mixture of thermosetting resin, microballoons and metal particles. The thermosetting resin is epoxy resin, polystyrene resin, polyurethane resin, polyester resin or polyethylene resin. Materials used for the metal particles include lead, tungsten, molybdenum, tantalum, ferrite or tungsten carbide.

A thermosetting resin layer is preferably provided between the array and the backing member to ensure firm bonding of lead wires to individual electrodes of the array.

BRIEF DESCRIPTION OF THE DRAWINGS

The present invention will be described in further detail with reference to the accompanying drawings in which.

DETAILED DESCRIPTION

Figure 1:
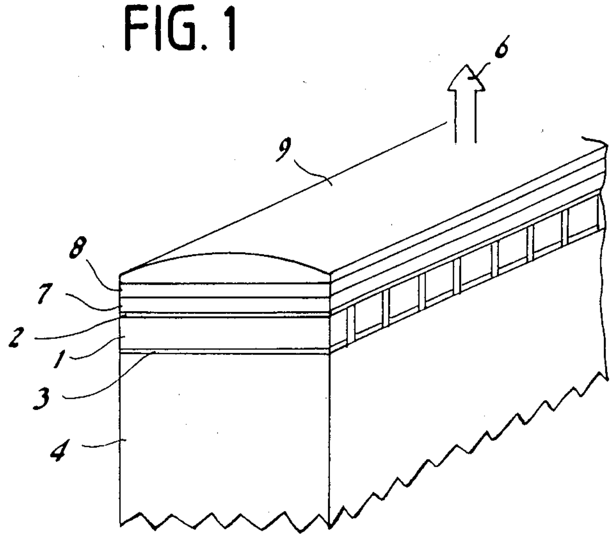
FIG. 1 is a perspective view of an ultrasonic probe including a backing member according to an embodiment of this invention.

Illustrated at 1 in FIG. 1 is a linear array of piezoelectric transducer elements each of which has its own electrode 3 on one surface and is attached to a common electrode 2 on the other surface for driving the individual transducer elements to transmit an acoustic beam 6 into a human body in response to electrical signals applied thereto and to receive echos returning from discontinuities within the body. To the front surface of the linear array is secured a laminated structure of acoustic impedance matching layers 7 and 8. Depending on applications, a single matching layer will suffice. An acoustic lens 9 may be provided at the energy entry surface of the transducer.

To the rear surface of the array is cemented a backing member 4. Backing member 4 is composed of urethane rubber or a mixture of urethane rubber and microballoons of glass or plastic. In a practical embodiment, the backing member is formed by attaching a mold to the rear of the array, pouring a liquid-phase backing material into the mold and allowing it to set. Alternatively, the backing member is made by an extrusion process and cemented to the array with a thermosetting adhesive material.

Preferably, the backing member 4 has a rugged rear surface having irregularities in the range between 3 mm and 5 mm as illustrated to scatter ultrasonic waves backward. One suitable material for the urethane rubber is Adapt E-No. 1, a trademark of Kokusai Chemical Kabushiki Kaisha. The acoustic impedance of this urethane rubber is $2.1\times10^5$ g/cm$^2$.sec, the Shore-A hardness being 98, the ultrasonic absorption coefficient being 2 dB/mm at a frequency of 3 MHz. Use is preferably made of microballoons of glass having a diameter of 100 micrometers, the microballoons being mixed in 15% weight ratio with the urethane rubber. The acoustic impedance of this mixture of $1.8\times10^5$ g/cm$^2$.sec, the Shore-A hardness being from 98 to 99, and the ultrasonic absorption coefficient being 2.5 dB/mm at 3 MHz.

A dynamic range as high as 100 dB can be obtained for the acoustic probe by eliminating side-lobe spurious emissions from the backing member. To this end, the backing member with an absorption coefficient of 2.5 dB/mm is dimensioned to a thickness in the range between 20 mm and 34 mm.

Another suitable material for the backing member is a urethane rubber of the quality having a Shore-A hardness of about 85, an acoustic impedance of about $3\times10^5$ g/cm$^2$.sec and an absorption coefficient of 1.5 to 2 dB/mm at 3 MHz. The acoustic impedance can be reduced to as low as $1.0\times10^5$ g/cm$^2$.sec by mixing glass microballoons to the urethane rubber without altering the absorption coefficient and hardness. Due to viscosity limitations, an acoustic absorption of $1.0\times10^5$ g/cm$^2$.sec is considered the lowermost practical value. Therefore, the desired practical value of absorption is in the range between 1.0 and $3.0\times10^5$ g/cm$^2$.sec. Although there is a 2-dB reduction in device sensitivity compared with those having no backing member, such reduction can be ignored in medical diagnostic purposes and there is still an improvement of 4 dB to 9 dB compared with those having a backing member of the type formed of ferrite rubber or the like. In other words, the backing member of the present invention affects the device sensitivity to a degree comparable to backing members formed of a gel such as silicone rubber.

The mechanical strength of the backing member of the invention is ten times greater than that of silicone rubber and is comparable to that of ferrite rubber.

It is found that microballoons of plastic may equally be as well mixed with the urethane rubber of the quality mentioned above.

Figure 3:
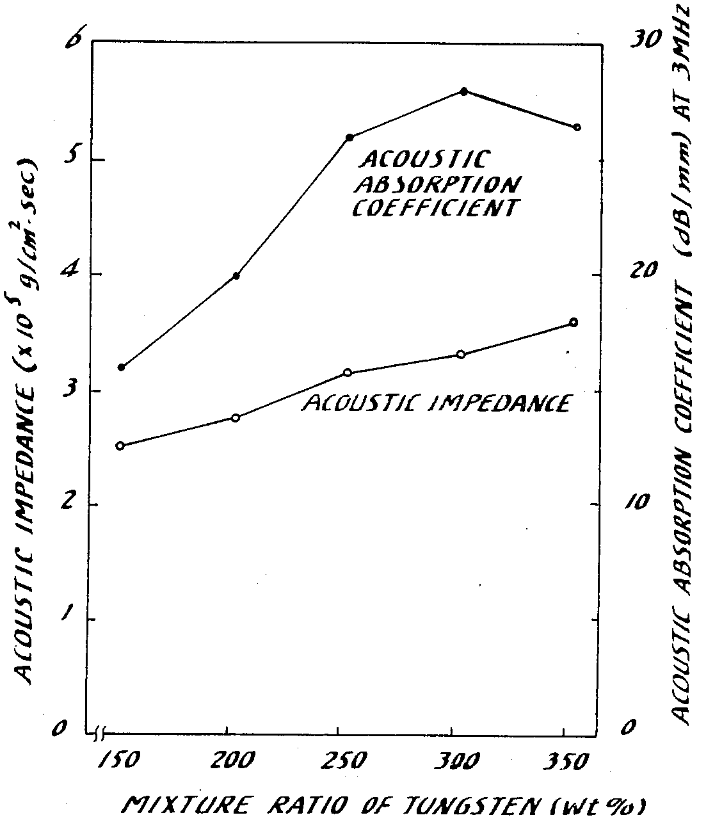
FIG. 3 is a graph showing acoustic characteristics of the backing member according to this invention.

Another suitable material for the backing member is a mixture of epoxy resin, microballoons and tungsten particles. In one example, 3% in weight ratio of microballoons having an average particle size of 50 micrometers and tungsten particles with an average particle size of 13 micrometers were mixed with epoxy resin (the type 2023/2103 available from Yokohama Three Bond Kabushiki Kaisha). The mixture ratio of the tungsten particles in weight percent to epoxy resin was varied in the range between 150% and 350%. The acoustic impedance and the absorption coefficient of the probe at 3 MHz were measured as a function of the mixture ratio in weight percent of tungsten particles and plotted as shown in FIG. 3. With tungsten particles mixed with a ratio of 250%, an acoustic impedance of $3\times10^5$ g/cm$^2$.sec and an absorption coefficient of 25 dB/mm (at 3 MHz) were obtained. A hardness of greater than 85 in Shore D hardness was obtained (A Shore-A value of 95 roughly corresponds to Shore-D hardness of 60).

In another example, 5% weight ratio of microballoons and 100% weight ratio of tungsten particles were mixed with epoxy resin. An acoustic impedance of $1.0\times10^5$ g/cm$^2$.sec and an absorption coefficient of 16 dB/mm at 3 MHz were obtained.

In a still further example, 2 wt % of microballoons and 500 wt % of tungsten particles were mixed with epoxy resin. The acoustic impedance and absorption coefficient were $6\times10^5$ g/cm$^2$.sec and 20 dB/mm (3 MHz), respectively.

By varying the mixture ratios of the microballoons and tungsten particles, acoustic impedance in a range from $1\times10^5$ g/cm$^2$.sec to $6\times10^5$ g/cm$^2$.sec and absorption coefficient in the range between 16 dB/mm and 25 dB/mm were obtained.

In either of these examples, a Shore-D hardness value of more than 85 was obtained.

It is apparent from the foregoing that other thermosetting materials such as polystylene, polyurethane, polyesther and polyethylene could equally be employed as well instead of the urethane.

It is further apparent from the foregoing that metal particles such as lead, molybdenum, tantalum, ferrite, tungsten-carbide can also be used instead of tungsten particles.

Figure 2:
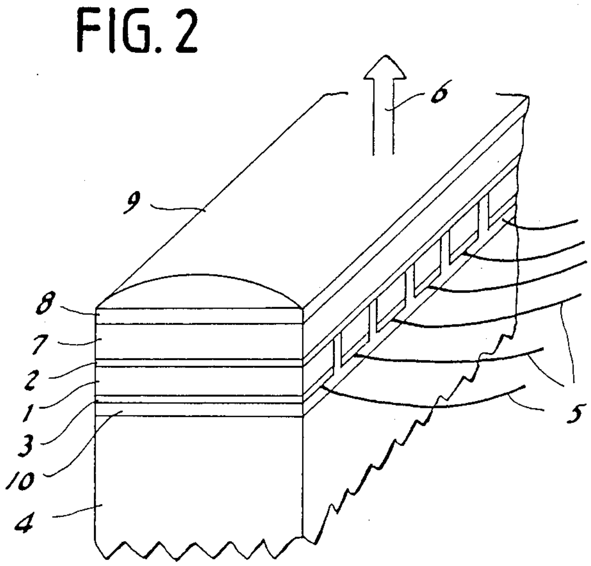
FIG. 2 is a perspective view of an ultrasonic probe according to a second embodiment of the invention.

An embodiment shown in FIG. 2 is similar to the FIG. 1 embodiment with the exception that it includes a thermosetting resin layer 10 between the array and the backing member 4. Lead wires 5 are connected to individual electrodes 3 of the array using ultrasonic bonding technique such that each wire extends from a point located inwardly from one end of the associated electrode. The resin layer 10 is composed of a material having a relatively low viscosity such as epoxy resin (the type ME 106 available from Nippon Pernox Kabushiki Kaisha) and is formed on the array by applying the epoxy resin in a liquid phase over the surface of the electrodes 3, so that it fills the spaces between adjacent piezoelectric elements and covers end portions of the connecting wires. With bubbles being removed, the epoxy resin layer is allowed to set to a desired hardness. The end portions of the lead wires 5 are thus embedded in the epoxy resin layer 10 and firmly secured in place. This arrangement significantly reduces the instances of lead wire disconnection. A backing member of the material mentioned previously is secured to the epoxy resin bonding layer 10.

It is desirable that the thickness of the layer 10 be as small as possible to minimize the otherwise undesirable consequences on device sensitivity and image resolution. It is found that an epoxy resin layer having a thickness smaller than $\frac{1}{8}$ of the wavelength of the acoustic energy results in a 0.4-dB device sensitivity reduction, a value which can be practically tolerated. Reduction in longitudinal resolution and reflection at the layer 10 were not observed.

It was shown that the acoustic probe constructed according to the present embodiment satisfactorily withstood a 10-cycle temperature test in which the ambient temperature was varied discretely between $-20°$ C. and $+40°$ C. with a dwell time of 1 hour for each temperature value. It is shown that the incidence of wire disconnections can be reduced to 1/1000 of that of the probe having no such epoxy resin layer.

The foregoing description shows only preferred embodiments of the present invention. Various modifications are apparent to those skilled in the art without departing from the scope of the present invention which is only limited by the appended claims. Therefore, the embodiments shown and described are only illustrative, not restrictive.

What is claimed is:

1. An ultrasonic probe comprising:

an array of piezoelectric transducer elements; and a backing member provided on one surface of said array, said backing member being composed of a mixture of urethane rubber and microballoons.

2. An ultrasonic probe as claimed in claim 1, wherein said backing member has a Shore-A hardness greater than 85 and an ultrasonic absorption coefficient greater than 1.5 dB/mm at a frequency of 3 MHz, and an acoustic impedance in the range between $1.0\times10^5$ g/cm$^2$ sec to $3.0\times105$ g/cm$^2$ sec.

3. An ultrasonic probe as claimed in claim 1, wherein said backing member has a rugged surface opposite to said one surface.

4. An ultrasonic probe as claimed in claim 3, wherein said rugged surface includes irregularities having a dimension in the range of 3 mm to 5 mm.

5. An ultrasonic probe as claimed in claim 1, further comprising a layer of thermosetting resin provided between said array and said backing member.

6. An ultrasonic probe as claimed in claim 5, wherein the thickness of said thermosetting resin layer is smaller then $\frac{1}{8}$ of the wavelength of ultrasonic energy generated by said array.

7. An ultrasonic probe as claimed in claim 5, wherein said thermosetting resin is epoxy resin.

8. An ultrasonic probe as claimed in claim 7, wherein said backing member has a rugged surface opposite surface to said one surface.

9. An ultrasonic probe comprising:

an array of piezoelectric transducer elements; and a backing member provided on one surface of said array, wherein said backing member is composed of a mixture of thermosetting resin, microballoons and solid particles.

10. An ultrasonic probe as claimed in claim 9, wherein said thermosetting resin is epoxy resin, polystyrene resin, polyurethane resin, polyester resin or polyethylene resin.

11. An ultrasonic probe as claimed in claim 9, wherein said solid particles are lead, tungsten, molybdenum, tantalum, ferrite or tungsten carbide.

12. An ultrasonic probe as claimed in claim 9, further comprising a thermosetting resin layer provided between said array and said backing member.

13. An ultrasonic probe as claimed in claim 12, wherein the thickness of said thermosetting resin layer is smaller than $\frac{1}{8}$ of the wavelength of ultrasonic energy generated by said array.

14. An ultrasonic probe as claimed in claim 9, wherein said solid particles comprise a metal.

* * * * *

UNITED STATES PATENT OFFICE
CERTIFICATE OF CORRECTION

Patent No. 4,571,520 Dated February 18, 1986

Inventor(s) Koetsu SAITO; Masami KAWABUCHI; Keisaku YAMAGUCHI ~~and Keiji IIJIMA~~

It is certified that error appears in the above-identified patent and that said Letters Patent are hereby corrected as shown below:

Column 1, line 60, change "microballons" to --Microballoons®--.

Column 1, line 65, insert as a new sentence --"Microballons®" and "Microballon " are registered U.S. Trademarks of W.R. Grace & Co. --

Column 2, line 33, change "microballoons" to --Microballoons®--.
line 34, change "microballoons" to --Microballoons®--.
line 50, change "microballoons" to --Microballoons®--.
line 51, change "microballoons" to --Microballoons®--.
line 68, change "microballoons" to --Microballoons®--.

Column 3, line 18, change "microballoons" to --Microballoons®--.
line 22, change "microballoons" to --Microballoons®--.
line 40, change "microballoons" to --Microballoons®--.
line 41, change "microballoons" to --Microballoons®--.
line 45, change "microballoons" to --Microballoons®--.
line 50, change "microballoons" to --Microballoons®--.

Column 4, line 49, change "microballoons" to --Microballoons®--.

Column 5, line 11, change "microballoons" to --Microballoons®--.

Signed and Sealed this

Twenty-first Day of April, 1987

*Attest:*

DONALD J. QUIGG

*Attesting Officer*

*Commissioner of Patents and Trademarks*